United States Patent
Hong et al.

(10) Patent No.: US 9,841,631 B2
(45) Date of Patent: Dec. 12, 2017

(54) DISPLAY PANEL AND METHOD OF MANUFACTURING THE SAME

(71) Applicant: Samsung Display Co., Ltd., Yongin-si, Gyeonggi-do (KR)

(72) Inventors: Sung-Hee Hong, Hwaseong-si (KR); Yeo-Geon Yoon, Suwon-si (KR); Jang-Il Kim, Asan-si (KR); Sei-Yong Park, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/269,563

(22) Filed: Sep. 19, 2016

(65) Prior Publication Data

US 2017/0003550 A1    Jan. 5, 2017

Related U.S. Application Data

(62) Division of application No. 14/308,392, filed on Jun. 18, 2014, now Pat. No. 9,466,617.

(30) Foreign Application Priority Data

Jan. 14, 2014 (KR) ........................ 10-2014-0004722

(51) Int. Cl.

| | |
|---|---|
| *G02F 1/1337* | (2006.01) |
| *H01L 27/12* | (2006.01) |
| *G02F 1/1333* | (2006.01) |
| *G02F 1/1335* | (2006.01) |
| *G02F 1/1341* | (2006.01) |
| *G02F 1/1343* | (2006.01) |
| *G02F 1/1368* | (2006.01) |
| *G02F 1/1362* | (2006.01) |

(52) U.S. Cl.
CPC ...... *G02F 1/133707* (2013.01); *G02F 1/1341* (2013.01); *G02F 1/1368* (2013.01); *G02F 1/133345* (2013.01); *G02F 1/133512* (2013.01); *G02F 1/134309* (2013.01); *H01L 27/1222* (2013.01); *H01L 27/1225* (2013.01); *H01L 27/1248* (2013.01); *H01L 27/1288* (2013.01); *G02F 2001/136222* (2013.01); *G02F 2201/123* (2013.01); *H01L 27/124* (2013.01)

(58) Field of Classification Search
CPC ........................ H01L 27/1222; H01L 27/1225
See application file for complete search history.

(56) References Cited

U.S. PATENT DOCUMENTS

| | | |
|---|---|---|
| 6,281,955 B1 | 8/2001 | Midorikawa et al. |
| 8,026,522 B2 | 9/2011 | Kim et al. |

(Continued)

FOREIGN PATENT DOCUMENTS

| | | |
|---|---|---|
| JP | 2005-078869 A | 3/2005 |
| JP | 2009-271103 A | 11/2009 |

(Continued)

*Primary Examiner* — Sang V Nguyen
(74) *Attorney, Agent, or Firm* — Innovation Counsel LLP

(57) ABSTRACT

A display panel includes a first substrate, a first thin film transistor disposed on the first substrate, a color filter disposed on the first thin film transistor, a passivation layer disposed on the color filter, a first opening being formed through the passivation layer and extending into the color filter, and a first pixel electrode disposed on the passivation layer, electrically connected to the first thin film transistor, and overlapping the first opening.

5 Claims, 14 Drawing Sheets

(56) References Cited

U.S. PATENT DOCUMENTS

| | | |
|---|---|---|
| 8,259,244 B2 | 9/2012 | Kim |
| 8,363,186 B2 | 1/2013 | Kim et al. |
| 8,390,769 B2 | 3/2013 | Cho et al. |
| 2005/0157226 A1* | 7/2005 | Lan .................. G02F 1/133514 349/106 |
| 2008/0252828 A1* | 10/2008 | Shin .................. G02F 1/133514 349/106 |
| 2010/0321283 A1* | 12/2010 | Mizuno ............. G02F 1/136227 345/88 |
| 2011/0025967 A1* | 2/2011 | Sohn ................. G02F 1/133711 349/124 |
| 2011/0109852 A1* | 5/2011 | Kim .................. G02F 1/133514 349/108 |
| 2011/0141423 A1 | 6/2011 | Cheng et al. |
| 2011/0222012 A1 | 9/2011 | Park et al. |
| 2012/0153292 A1 | 6/2012 | Nakamura et al. |
| 2012/0249940 A1 | 10/2012 | Choi et al. |
| 2013/0101755 A1* | 4/2013 | Lee .................. G02F 1/133707 428/1.23 |
| 2013/0242239 A1* | 9/2013 | Chang ............... G02F 1/133707 349/106 |

FOREIGN PATENT DOCUMENTS

| | | |
|---|---|---|
| JP | 2010-271462 A | 12/2010 |
| KR | 1020090100952 A | 9/2009 |

\* cited by examiner

DISPLAY PANEL AND METHOD OF MANUFACTURING THE SAME

This application is a divisional of U.S. patent application Ser. No. 14/308,392, filed on Jun. 18, 2014, which claims priority to and the benefit of Korean Patent Application No. 10-2014-0004722, filed on Jan. 14, 2014, as authorized under 35 USC §119. The entire contents of these previously filed applications are incorporated herein by reference.

BACKGROUND

1. Field

The present disclosure of inventive concept(s) relates to a display panel and a method of manufacturing the display panel.

More particularly, the present disclosure relates to a display panel for a liquid crystal display apparatus having plural domains and a method of manufacturing the display panel.

2. Description of Related Technology

Recently, it has become increasingly desirable to mass produce display apparatuses having light weight and/or small sizes and/or low power consumption and/or good side visibility. Therefore flat or otherwise thin display apparatuses such as a plasma display apparatus, a liquid crystal display (LCD) apparatus and an organic light emitting display (OLED) apparatus has been highly regarded due to the ability to produce these with relatively small sizes, light weight and low-power-consumption.

Various ones of these display apparatuses include color filters for expressing respective colors (e.g., Red, Green, Blue and optionally White) and a passivation layer disposed on the color filters for sealing them. The color filters may be disposed in an upper substrate or a lower substrate. In either case, if a portion of the color filter is not protected by the passivation layer, the color filter may emit contaminants and/or particles which can degrade display quality.

On the other hand, for the sake of improving side viewing visibility, it is often desirable to induce plural and different domains of liquid crystal orientation in Liquid Crystal Display (LCD) type devices. However, the functions of fully encasing the color filters in a passivation layer, of providing plural domains and of providing a relatively thin display device can interfere with one another.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of inventive concept(s) provides a display panel capable of improving a display quality.

One or more exemplary embodiments of the inventive concept(s) also provide a method of manufacturing the display panel.

According to an exemplary embodiment, a display panel includes a first substrate, a first thin film transistor disposed on the first substrate, a color filter disposed on the first thin film transistor, a passivation layer disposed on the color filter, a first opening being formed through the passivation layer and extending into the color filter so as to define a recess, and a first pixel electrode disposed on the passivation layer, electrically connected to the first thin film transistor, and overlapping the first opening. Before the opening is sealed close, it may be used to let out outgassings from the color filter.

In an exemplary embodiment, the color filter may make contact with the first pixel electrode through the first opening.

In an exemplary embodiment, the display panel may further include a second substrate facing the first substrate, and a liquid crystal layer disposed between the first and second substrates, and comprising a liquid crystal molecules and cured reactive mesogens.

In an exemplary embodiment, the display panel may further include a black matrix disposed on the second substrate to block light. The black matrix may be spaced apart from the first opening in the plan view.

In an exemplary embodiment, a recess may be formed at a portion of the color filter which overlaps the first opening. Depth of the recess may be less than about 0.5 µm.

In an exemplary embodiment, the first pixel electrode may include a first stem which extends in a second direction substantially perpendicular to a first direction, a second stem which extends in the first direction, and a plurality of slits which extends from the first stem or the second stem.

In an exemplary embodiment, the first and second stems of the first pixel electrode may divide the first pixel electrode into at least four domains. An extension direction of the slits in each of the domain may be different from that of each other domains.

In an exemplary embodiment, the first opening may overlap a portion where the first stem of the first pixel electrode crosses the second stem of the first pixel electrode.

In an exemplary embodiment, entire portion of the first opening may be overlapped with the first stem, second stem or the slits of the first pixel electrode.

In an exemplary embodiment, the opening may have a shape substantially same as the first stem and the second stem in a plan view.

In an exemplary embodiment, the display panel may further include a first data line electrically connected to the first thin film transistor, a second data line spaced apart from the first data line, a second thin film transistor electrically connected to the second data line, and a second pixel electrode electrically connected to the second thin film transistor. Voltages different from each other may be developed on the first pixel electrode and on the second pixel electrode.

In an exemplary embodiment, a second opening overlapping the second pixel electrode may be formed through the passivation layer.

In an exemplary embodiment, the first electrode may include a first stem which extends in a second direction substantially perpendicular to a first direction, a second stem which extends in the first direction, and a plurality of slits which extends from the first stem or the second stem. The second electrode may include a first stem which extends in the second direction, a second stem which extends in the first direction, and a plurality of slits which extends from the first stem or the second stem.

In an exemplary embodiment, the display panel may further include a second substrate facing the first substrate, and a black matrix disposed on the second substrate to block light. The black matrix is spaced apart from the first opening and the second opening of the passivation layer in a plan view.

In an exemplary embodiment, the display panel may further include a common electrode disposed on the black matrix of the second substrate.

According to an exemplary embodiment, a method of manufacturing a display panel includes forming an array substrate, forming an opposite substrate facing the array substrate, and forming a liquid crystal layer between the array substrate and the opposite substrate. The forming the array substrate comprises forming a thin film transistor on a substrate, forming a color filter on the thin film transistor, forming a passivation layer on the color filter to cover the color filter, forming an opening extending through the passivation layer and into the color filter to thereby define a recess, and forming a pixel electrode on the passivation layer, the pixel electrode electrically connected to the thin film transistor, the pixel electrode overlapping the opening of the passivation layer.

In an exemplary embodiment, forming the liquid crystal layer may include injecting a liquid crystal material between the array substrate and the opposite substrate, the liquid crystal material comprising a liquid crystal molecules and reactive mesogens, and hardening the reactive mesogens by irradiating with light.

In an exemplary embodiment, hardening the reactive mesogen may include irradiating light in a direction from the array substrate to the opposite substrate.

In an exemplary embodiment, forming the opening through the passivation layer may include dry etching the passivation layer using a mask having a silt or half-tone area at a first area corresponding to the opening.

In an exemplary embodiment, in forming the opening through the passivation layer, a recess may be formed on the color filter by etching a portion of the color filter corresponding to the opening. Depth of the recess of the color filter may be less than about 0.5 μm.

According to the present disclosure of inventive concept(s), an opening of a passivation layer of an array substrate of a display panel is disposed in a display area through which light passes, so that photo-curable impurities of the color filter near the opening may be cured and thus rendered immobile during photocuring process for pretilt angle of liquid crystal molecules of a liquid crystal layer. Thus, display quality degradation caused by otherwise mobile impurities from the color filter may be prevented.

In addition, half tone mask is used to form the opening of the passivation layer, so that damage to the color filter CF may be decreased.

BRIEF DESCRIPTION OF THE DRAWINGS

The above and other features of the present disclosure of inventive concept(s) will become more apparent by describing in detail exemplary embodiments thereof with reference to the accompanying drawings, in which.

DETAILED DESCRIPTION

Figure 1:
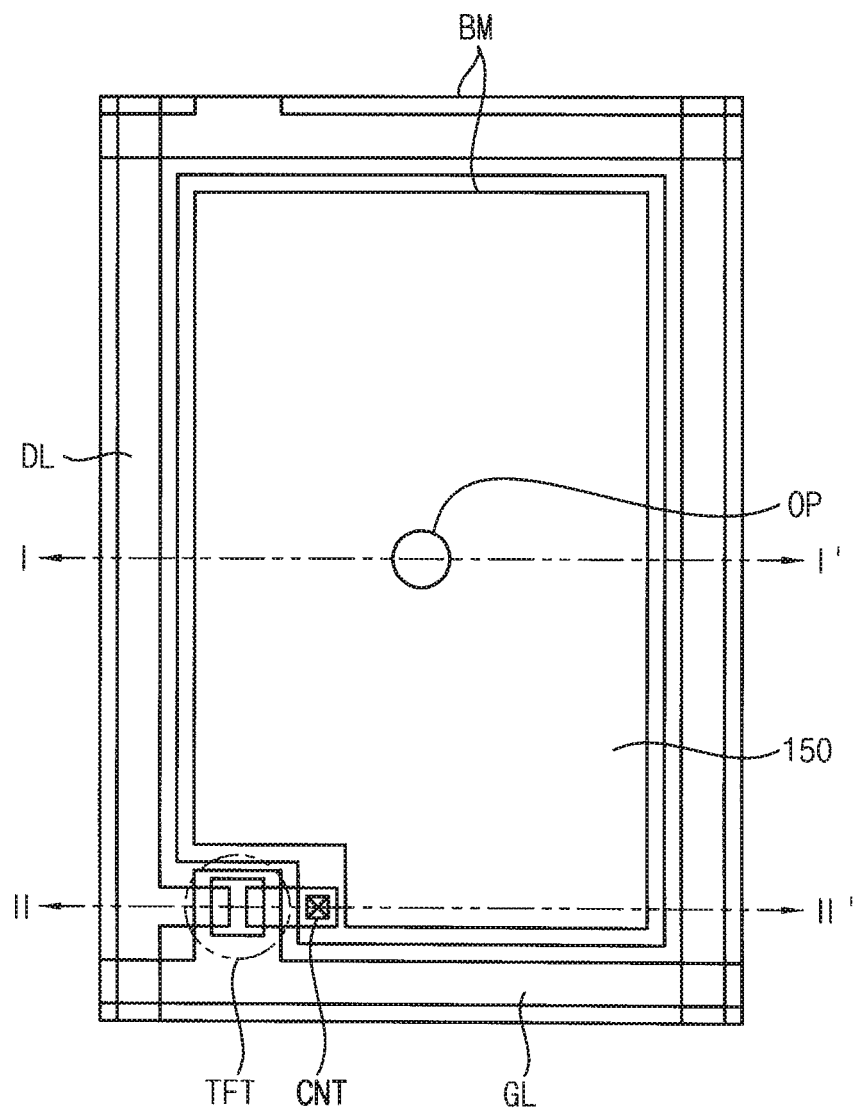
FIG. 1 is a top plan view illustrating a first display panel in accordance with the present disclosure.
Figure 2A:
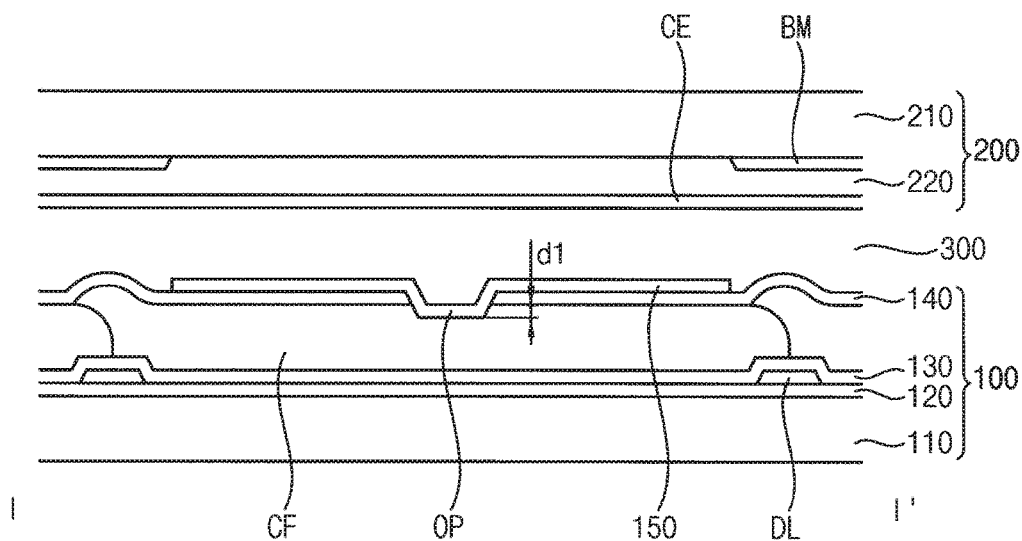
FIG. 2A is a cross-sectional view taken along a line I-I' of FIG. 1.
Figure 2B:
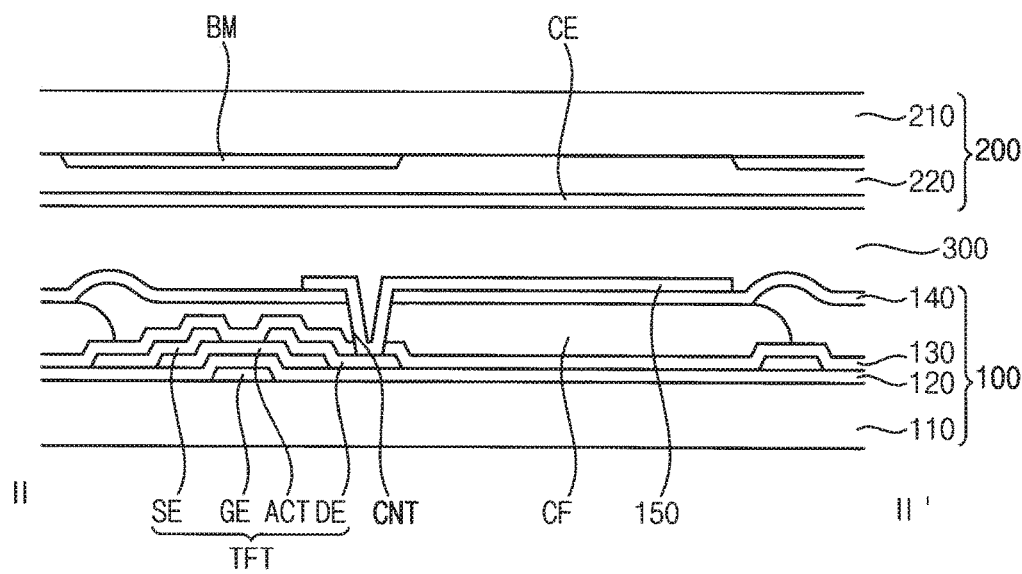
FIG. 2B is a cross-sectional view taken along a line II-II' of FIG. 1.

Hereinafter, the present disclosure of inventive concept(s) will be provided in greater detail with reference to the accompanying drawings in which:

FIG. 1 is a top plan view illustrating a first display panel that is structured in accordance with the present disclosure of the inventive concept(s). FIG. 2A is a cross-sectional view taken along a line I-I' of FIG. 1. FIG. 2B is a cross-sectional view taken along a line II-II' of FIG. 1.

Although only one of regularly repeated pixel areas that populate a display area is generally described in the figures of the present disclosure, it is to be understood that the display panels of the exemplary embodiments generally include large numbers of such pixel units respectively formed in a tessellating manner over the whole of the display area of the display device. The pixel areas are typically arrayed for example as a regular matrix structure having a plurality of rows and columns. The pixel areas typically have same basic and repeated structures (although some variation for example in color of color filter portions or sizes or shapes of the respective pixel-electrodes may occur), so that only one pixel area will be described herein as an example. Although the pixel area has a rectangular shape in the here provided figures, one or more of the pixel areas may have various modifications made to them for example in terms of size and/or shape and/or number of field altering slits and/or other fine features included therein. For example the pixel electrodes may be patterned to have V or Z shapes.

Referring to FIGS. 1 to 2B, a first exemplary display panel includes a TFT array substrate 100, a spaced apart opposite substrate 200 facing the TFT array substrate 100 and a liquid crystal layer 300 interposed between the TFT array substrate 100 and the opposite substrate 200.

The array substrate 100 includes a light-passing first substrate 110, a gate line GL, a gate electrode GE, a first insulation layer 120, a semiconductive active pattern ACT, a data line DL, a data electrode DE, a source electrode SE, a second insulation layer 130, a color filter CF, a passivation layer 140 and a light-passing pixel electrode 150.

The first substrate 110 may include a material which has relatively high optical transmittance, thermal resistance, and chemical resistance. For example the first base substrate 100 may include any one or more members selected from the group consisting of glass, polyethylenenaphthalate, polyethylene terephthalate, polyacryl and various mixtures thereof.

The gate line GL and the gate electrode GE are disposed on the first substrate 110. The gate line GL extends in a first direction D1.

The gate line GL is electrically connected to the gate electrode GE. For example, the gate electrode GE is integrally protruded from (branched out from) the gate line GL in a second direction D2 which is substantially perpendicular to the first direction D1.

The first insulation layer 120 is disposed on the first substrate 110 on which the gate line GL and the gate electrode GE are predisposed. The first insulation layer 120 may include inorganic material such as a silicon oxide (SiOx) and/or a silicon nitride (SiNx). In addition, the first insulation layer 120 may include an organic insulating material having relatively high dielectric permittivity. In addition, the first insulation layer 120 may have a multi-layer structure of laminated together inorganic and organic insulating layers. The first insulation layer 120 may serve as a dielectric layer providing capacitive coupling between the gate electrode and an overlying active pattern ACT.

The active pattern ACT is disposed on top of the first insulating layer 120 and overlaps the gate electrode GE. The active pattern ACT may include a semiconductive layer consisting of amorphous silicon (a-Si:H) and an ohmic contact layer consisting of n+ amorphous silicon (n+ a-Si:H). In addition or alternatively, the active pattern ACT may include a semiconductive oxide. The semiconductive oxide may include an amorphous oxide including at least one member selected from the group consisting of indium (In), zinc (Zn), gallium (Ga), tin (Sn) and hafnium (Hf) oxides.

The data line DL, the data electrode DE and the source electrode SE are disposed on the first insulation layer 120 on which the active pattern ACT is predisposed.

The data line DL extends in the second direction D2. The data line DL is electrically connected to a source electrode SE; for example with the source electrode SE integrally protruding from (branching out from) the data line D. The source electrode SE overlaps the active pattern ACT. The drain electrode DE is spaced apart from the source electrode, and also overlaps the active pattern ACT. A channel region may be defined in the portion of the active pattern ACT which is not overlapped by the source and drain electrodes.

The gate electrode GE, the active pattern ACT, the source electrode SE and the drain electrode DE may form a switching element such as a thin film transistor TFT.

The second insulation layer 130 is vertical disposed so as to sealing-wise sandwich the thin film transistor TFT between the second insulation layer 130 and the first insulation layer 120. At the same time, the second insulation layer 130 is vertical disposed so as to sealing-wise sandwich the data line DL between the second insulation layer 130 and the first insulation layer 120. As will become apparent shortly, these sealing-wise sandwiching functions substantially protected the sealed-in elements (e.g., the TFT and the data line DL) from exposure to contaminants which might escape from a soon-described color filters layer (CF, CF'). The second insulation layer 130 may include an inorganic material such as a silicon oxide (SiOx) and/or a silicon nitride (SiNx). In addition, the second insulation layer 130 may include an organic insulating material having a relatively low dielectric permittivity. In addition, the second insulation layer 130 may have a multi-layer structure of laminated together inorganic and organic insulating layers.

The color filters layer CF-CF' is disposed on the second insulation layer 130. The color filters layer include respective color filters (e.g., CF, CF', CF") which respectively provide respective coloration attributes (or none if a clear or white filter) to light rays passing through the liquid crystal layer 300. The color filters (e.g., CF, CF', CF", etc.) may include primary colored ones such as a red color filter, a green color filter and blue color filter. Each color filter (e.g., CF) corresponds to a respective pixel area. The color filters adjacent to each other may have different colors. Each color filter (e.g., CF) may be overlapped with a next adjacent color filter (e.g., CF") in a boundary region of the pixel area. Alternatively, the color filter CF may be spaced apart (not shown) from the next adjacent color filters (e.g., CF" and CF') in the respective boundary regions of the pixel area.

The passivation layer 140 is disposed on the color filters layer CF-CF'. The passivation layer 140 is formulated to seal the coloration materials in and to thus prevent out-gassing, leaching out or other forms of coming off of the color filter materials of the color filters layer CF-CF' and to thus prevent harmful outflow of impurities into other layers from the color filters layer CF-CF'. The passivation layer 140 may include an inorganic material such as a silicon oxide (SiOx) and/or a silicon nitride (SiNx). In addition, the passivation layer 140 may include an organic insulating material having a relatively low dielectric permittivity. In addition, the passivation layer 140 may have a multi-layered structure of laminated together inorganic and organic insulating layers.

In order to create plural optical domains within the liquid crystal layer 300 while not increasing the thickness of the display device, a depression-defining opening OP is formed through the passivation layer 140 to optionally extend yet deeper into the underlying color filter CF. In the exemplary first embodiment, the opening OP is formed at a center portion of the pixel area through which a corresponding pixel image is formed for viewing by users of the display device who are facing the display area head on or are looking at the display area from a side angle and receiving the light rays passed through to them as a result of the liquid crystal layer 300 having plural optical domains induced therein. In a top plan view of the pixel area, the opening OP is spaced apart from the surrounding black (and thus opaque) matrix BM. Thus, the opening OP is not overlapped with the black matrix BM. The opening OP is overlapped by the pixel electrode 150 that is next formed over the passivation layer 140. Before the opening is sealed close, it may be used to let out outgassings from the color filter.

In other words, even though the opening OP creates a break in the sealing-in function of the passivation layer 140 and thereby exposes the color filter CF at the location of the opening OP (for example so as to allow gasses present within the color filter material during manufacture, to outgas) and that breach of the sealing-in function of the passivation layer 140 is closed by providing the pixel electrode 150 so that it directly connects to the color filter through the opening OP and closes up the exposure created by the opening OP. Due to the depth of the opening OP, a recess or depression having a first depth d1 may be formed at a portion of the color filter CF corresponding to the opening OP of the passivation layer 140. The otherwise generally planar shape of the pixel electrode 150 is deformed by the intentionally formed depression and accordingly, the local electric fields formed in the vicinity of the opening OP and as between the pixel electrode 150 and the common electrode (CE) are deformed.

In one embodiment, the first depth d1 from the top surface of the planar portion of the color filter CF to the bottom of the recess of the color filter CF is less than about 0.5 μm. Accordingly, plural optical domains may be formed without increasing the thickness of the display device and without allowing harmful materials from within the color filter CF to escape through the opening OP to the outside.

As indicated above, the pixel electrode 150 is disposed on the passivation layer 140. The pixel electrode 150 is additionally (as shown in FIG. 2B) electrically connected to the drain electrode DE of the thin film transistor TFT through a contact hole CNT which extends through the passivation layer 140, the color filter CF and the second insulation layer 130. The pixel electrode 150 may include a transparent conductive material, such as indium tin oxide (ITO), indium zinc oxide (IZO) and etc.

The opposite substrate 200 includes a second substrate 210, a black matrix BM, a protection layer 220 and the common electrode CE.

The second substrate 210 faces the first substrate 110. The second substrate 210 may include a material which has relatively high optical transmittance, thermal resistance, and chemical resistance. For example the second substrate 210 may include any one or more members selected from the group consisting of glass, polyethylenenaphthalate, polyethylene terephthalate, polyacryl and mixtures thereof.

The black matrix BM is disposed on the second substrate 210. The black matrix BM includes a light blocking material. The black matrix BM is formed in a non-display area. The black matrix BM overlaps the gate lines GL, the data lines DL and the thin film transistors TFT of the array substrate 100. The black matrix BM may overlap an outer boundary portion of the pixel electrode 150 of the array substrate 100.

The protection layer 220 is disposed on the second substrate 210 on which the black matrix BM is formed. The protection layer 220 flattens (planarizes) and protects the black matrix, and prevents outflow of impurities. The protection layer 220 may include an acrylic-epoxy material.

The common electrode CE is disposed on the protection layer 220. The common electrode CE may be blanket formed to cover an entire display area portion of the second substrate 210. The common electrode CE may include a transparent conductive material, such as indium tin oxide (ITO), indium zinc oxide (IZO) and etc.

The liquid crystal layer 300 is disposed between the array substrate 100 and the opposite substrate 200. The liquid crystal layer 300 includes liquid crystal molecules having optical anisotropy. The liquid crystal molecules are driven by electric fields formed by the pixel electrode 150 and the common electrode CE, so that an image is displayed by passing or blocking light that has been selectively polarized in various ways by the liquid crystal layer 300. The liquid crystal layer 300 further includes photocurable material, such as a reactive mesogen. The reactive mesogen may be photocured as an alignment layer attached to one or more of the facing surfaces of the array substrate 100 and the opposite substrate 200 such that the liquid crystal molecules may have a pretilt angle when no field is applied.

The opening OP of passivation layer 140 of the array substrate 100 is disposed in a display area where light passes. Thus, during a photocuring process to photocure the liquid crystal molecules and/or alignment layer(s) of the liquid crystal layer 300, photocurable impurities formed adjacent to the opening OP may be cured at the same time. Therefore, display quality degradation caused by the impurities form the color filter CF may be prevented.

In addition, as the first depth d1 of the recess of the color filter CF corresponding to the opening OP is less than about 0.5 μm, damage to the color filter CF may be decreased, so that impurities formed at the color filter CF may be reduced. Accordingly, display quality degradation due to the impurities may be prevented.

Figure 3:
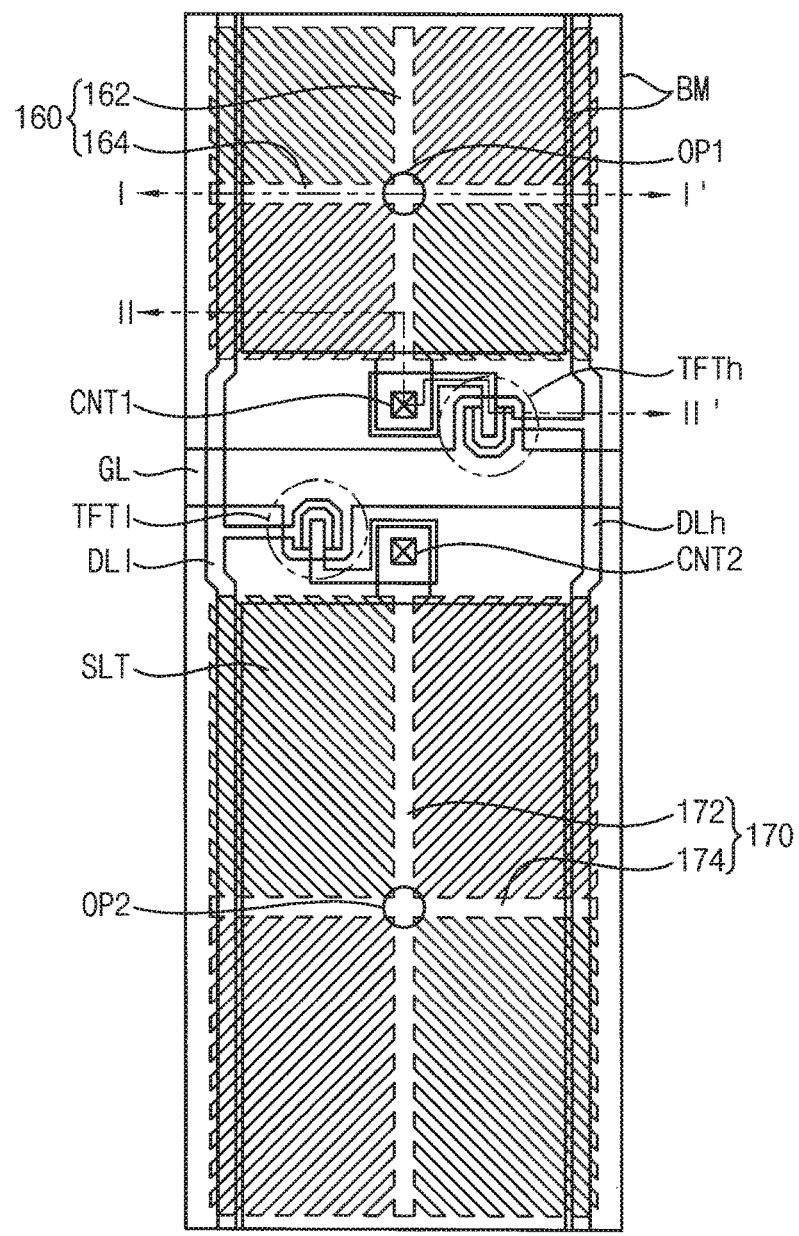
FIG. 3 is a plan view illustrating a second display panel in accordance with the present disclosure.
Figure 3:
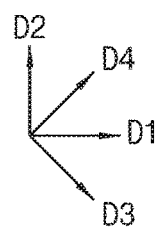
Figure 4A:
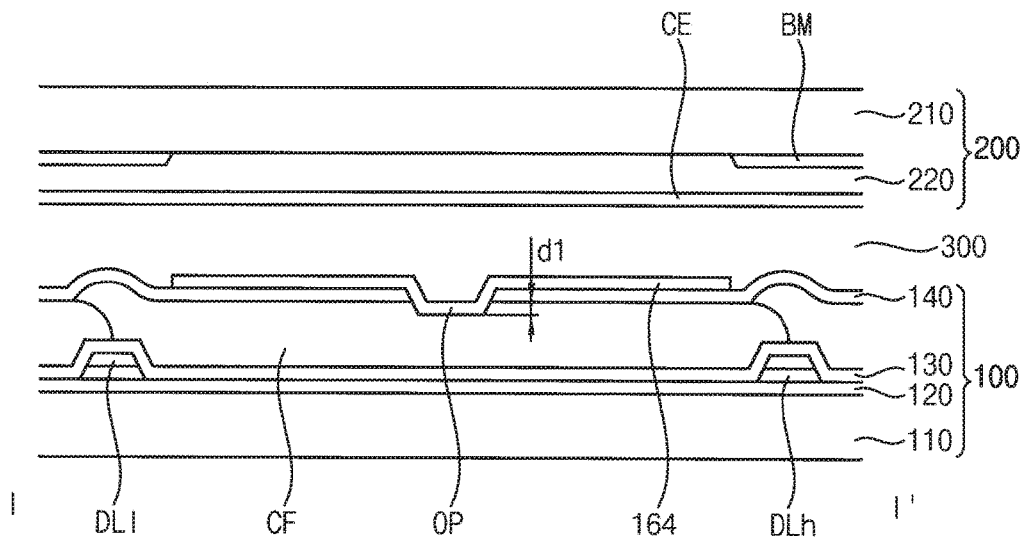
FIG. 4A is a cross-sectional view taken along a line I-I' of FIG. 3.
Figure 4B:
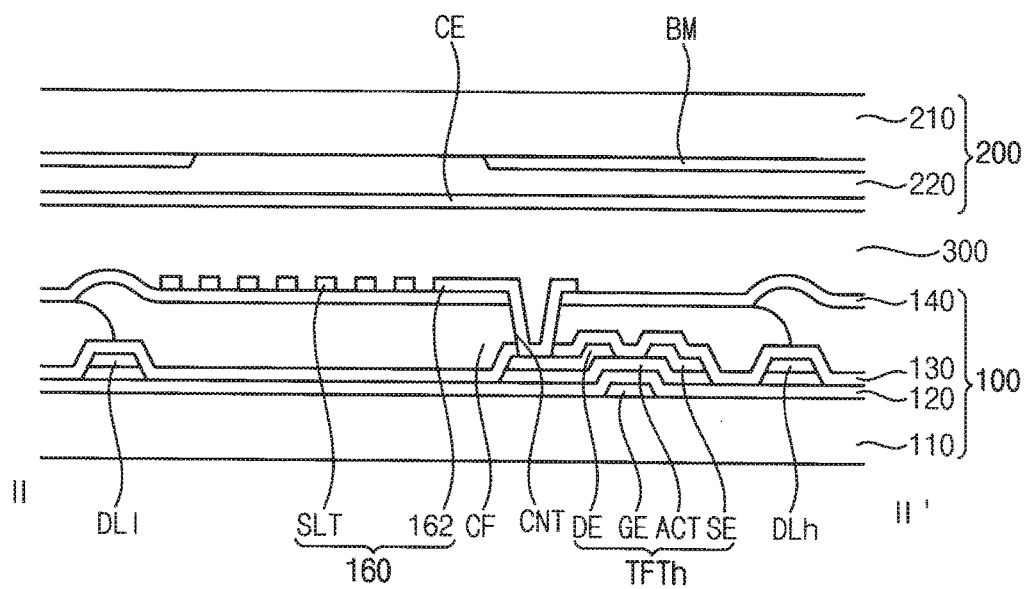
FIG. 4B is a cross-sectional view taken along a line II-II' of FIG. 3.

FIG. 3 is a plan view illustrating a display panel according to another exemplary embodiment in accordance with the present disclosure. FIG. 4A is a cross-sectional view taken along a line I-I' of FIG. 3. FIG. 4B is a cross-sectional view taken along a line II-IF of FIG. 3.

Referring to FIGS. 3 to 4B, the illustrated display panel includes an array substrate 100, an opposite substrate 200 facing the array substrate 100 and a liquid crystal layer 300 interposed between the array substrate 100 and the opposite substrate 200.

The array substrate 100 includes a first substrate 110, a gate line GL from which there branch out first and second gate electrodes GE (one for the high or "h" TFT and the other for the low or "1" TFT), a first insulation layer 120, first and second active pattern ACT1 and ACT2, a first data line DLh (a.k.a. the high or "h" data line), a second data line DL1 (a.k.a. the low or "1" data line), first and second data electrodes DE, first and second source electrodes SE, a second insulation layer 130, a color filter CF, a passivation layer 140, a first pixel electrode 160 (a.k.a. the high or "h" pixel electrode) and a second pixel electrode 170 (a.k.a. the low or "1" pixel electrode).

The first substrate 110 may include a material which has relatively high optical transmittance, good thermal resistance, and good chemical resistance. For example the first base substrate 100 may include any one or more members selected from the group consisting of glass, polyethylenenaphthalate, polyethylene terephthalate, polyacryl and mixtures thereof.

The gate line GL and the first and second gate electrodes GE are disposed on the first substrate 110. The gate line GL extends in a first direction D1.

The gate line GL is electrically connected to the first and second gate electrodes GE. For example, the first gate electrode may be integrally protruded from the gate line GL in a second direction D2 which is substantially perpendicular to the first direction D1, and the second gate electrode may be integrally protruded from the gate line GL opposite to the first gate electrode GE The first insulation layer 120 is disposed on the first substrate 110 on which the gate line GL and the first and second gate electrodes GE are pre-disposed. The first insulation layer 120 may include an inorganic material such as a silicon oxide (SiOx) and/or a silicon nitride (SiNx). In addition, the first insulation layer 120 may include an organic insulating material having relatively low permittivity. In addition, the first insulation layer 120 may have a multi-layered structure of inorganic and organic insulating layers laminated together.

The first and second active patterns ACT are disposed on the first insulating layer 120. The first active pattern overlaps the first gate electrode. The second active pattern overlaps the second gate electrode.

The first and second active patterns ACT may include a semiconductive layer consisting of amorphous silicon (a-Si: H) and an ohmic contact layer consisting of n+ amorphous silicon (n+ a-Si:H). In addition or alternatively, the first and second active patterns ACT may include a semiconductive oxide. The semiconductive oxide may include an amorphous oxide including at least one selected from the group consisting of indium (In), zinc (Zn), gallium (Ga), tin (Sn) and hafnium (Hf) oxides.

The first and second data lines DLh and DL1, the first and second data electrodes DE and the first and second source electrodes SE are disposed on the first insulation layer 120 on which the first and second active patterns ACT are pre-disposed.

The first data line DLh extends in the second direction D2. The first data line DLh is electrically connected to a first source electrode. The first source electrode overlaps the first active pattern. The first drain electrode is spaced apart from the first source electrode, and overlaps the first active pattern.

The second data line DL1 is spaced apart from the first data line DLh, and extends in the second direction D2. The second data line DL1 is electrically connected to a second source electrode. The second source electrode overlaps the first active pattern. The second drain electrode is spaced apart from the second source electrode, and overlaps the second active pattern.

The first gate electrode, the first active pattern, the first source electrode and the first drain electrode form a first thin film transistor TFT1.

The second gate electrode, the second active pattern, the second source electrode and the second drain electrode form a second thin film transistor TFT2.

The second insulation 130 is disposed over the first and second thin film transistors TFT1 and TFT2 where the latter are underlain by the first insulation layer 120. The second insulation 130 is also disposed over the first and second data lines DLh and DL1 where the latter are underlain by the first insulation layer 120. The second insulation layer 130 may include an inorganic material such as a silicon oxide (SiOx) and/or a silicon nitride (SiNx). In addition, the second insulation layer 130 may include an organic insulating material having relatively low permittivity. In addition, the second insulation layer 130 may have a multi-layer structure of inorganic and organic insulating layers.

The color filters layer CF-CF' is disposed on the second insulation layer 130. The color filters (CF, CF', etc.) supplies respective colors to the lights passing through corresponding areas of the liquid crystal layer 300. The color filters CF, CF' may include a red color filter, a green color filter and blue color filter. The color filters CF correspond to respective ones of the pixel areas. The color filters adjacent to each other may have different colors. The color filter CF may be overlapped with adjacent color filter CF in a boundary of the pixel area. In addition, the color filter CF may be spaced apart from adjacent color filter CF in the boundary of the pixel area.

The passivation layer 140 is disposed on the color filter CF. The passivation layer 140 prevents come off of the materials of the color filters layer CF-CF' and prevents from outflow, any impurities formed from the color filters CF. The passivation layer 140 may include an inorganic material such as a silicon oxide (SiOx) and/or a silicon nitride (SiNx). In addition, the passivation layer 140 may include an organic insulating material having relatively low permittivity. In addition, the passivation layer 140 may have a multi-layered structure of inorganic and organic insulating layers.

A first opening OP1 is formed through the passivation layer 140 in the light-passing area of the first pixel electrode 160 (a.k.a. the high or "h" pixel electrode). In a plan view, the first opening OP1 is spaced apart from the black matrix BM. Thus, the first opening OP1 is not overlapped with the black matrix BM.

The first opening OP1 exposes the color filter CF. Accordingly, the first pixel electrode 160 directly connects to the color filter through the first opening OP1. A recess having a first depth d1 may be formed at a portion of the color filter CF corresponding to the first opening OP1 of the passivation layer 140.

The first depth d1 of the recess of the color filter CF may be less than about 0.5 μm.

A second opening OP2 is formed through the passivation layer 140 in the light-passing area of the second pixel electrode 170 (a.k.a. the low or "l" pixel electrode). In a plan view, the second opening OP2 is spaced apart from the black matrix BM. Thus, the second opening OP2 is not overlapped with the black matrix BM.

The second opening OP2 exposes the color filter CF. Accordingly, the second pixel electrode 170 directly connects to the color filter through the second opening OP2. A recess having a first depth d1 may be formed at a portion of the color filter CF corresponding to the second opening OP2 of the passivation layer 140.

The first depth d1 of the recess of the color filter CF may be less than about 0.5 μm.

The first pixel electrode 160 is disposed on the passivation layer 140. The first pixel electrode 160 is electrically connected to the first drain electrode of the first thin film transistor TFT1 through a first contact hole CNT1 formed through the passivation layer 140, the color filter CF and the second insulation layer 130. The first pixel electrode 160 may include a transparent conductive material, such as indium tin oxide (ITO), indium zinc oxide (IZO) and etc.

The first pixel electrode 160 is patterned to include a first stem 162 and a second stem 164. The first stem 162 extends in the second direction D2. The second stem 164 extends in the first direction D1, and crosses the first stem 162. The first and second stems 162 and 164 divide the electric fields formed by the first pixel electrode 160 into a corresponding four domains surrounding the first opening OP1. A plurality of slits SLT are formed to extend in inclined directions from the first or second stem 162 or 164 in each of the domains. The slits SLT may extend in directions different from each of the domains. Accordingly, liquid crystal molecules of the liquid crystal layer 300 are arranged in different directions corresponding to each of the domains, so that the domains have different liquid crystal directors from each other. For example, the slits SLT may extend in a third direction D3 which is different from the first and second directions D1 and D2, or a fourth direction D4 which is perpendicular to the third direction D3. Accordingly, the liquid crystal directors may head to a center of the first pixel electrode 160.

The first opening OP1 may be formed to overlap a portion where the first stem 162 and the second stem 164 cross each other. For example, the first opening OP1 may be disposed corresponding to a center of the first pixel electrode 160. Although a recess is formed at a portion of the color filter corresponding to the first opening OP1, liquid crystal director of liquid crystal molecules adjacent to the recess heads to the center of the first pixel electrode 160, so that the liquid crystal director adjacent to the recess align with liquid crystal directors adjacent to the first opening OP1. Thus, artifacts that may be formed near the first opening OP1 may be reduced.

The second pixel electrode 170 is similarly patterned and disposed on the passivation layer 140. The second pixel electrode 170 is electrically connected to the second drain electrode of the second thin film transistor TFT2 through a second contact hole CNT2 formed through the passivation layer 140, the color filter CF and the second insulation layer 130. The second pixel electrode 170 may include a transparent conductive material, such as indium tin oxide (ITO), indium zinc oxide (IZO) and etc.

The patterned second pixel electrode 170 includes a first stem 172 and a second stem 174. The first stem 172 extends in the second direction D2. The second stem 174 extends in the first direction D1, and crosses the first stem 172. The first and second stems 172 and 174 divide the second pixel electrode 170 into four domains. A plurality of slits SLT extends from the first or second stem 172 or 174 in each of the domain. The slits SLT may extend in directions different from each of the domains. Accordingly, liquid crystal molecules of the liquid crystal layer 300 are arranged in different directions corresponding to each of the domains, so that the domains have different liquid crystal directors each other. For example, the slits SLT may extend in a third direction D3 which is different from the first and second directions D1 and D2, or a fourth direction D4 which is perpendicular to the third direction D3. Accordingly, the liquid crystal directors may head to a center of the second pixel electrode 170.

The second opening OP2 may be formed to overlap a portion where the first stem 172 and the second stem 174 cross each other. For example, the second opening OP2 may be disposed corresponding to a center of the second pixel electrode 170. Although a recess is formed at a portion of the color filter corresponding to the second opening OP2, liquid crystal director of liquid crystal molecules adjacent to the recess heads to the center of the second pixel electrode 160, so that the liquid crystal director adjacent to the recess line up with the liquid crystal directors adjacent to the second opening OP1. Thus, artifacts formed near the second opening OP2 may be reduced.

A first voltage may be applied to the first pixel electrode 160 through the first thin film transistor TFT1. A second voltage different from the first voltage may be applied to the second pixel electrode 170 through the second thin film transistor TFT2. For example, the first voltage may be higher than the second voltage, the first voltage may be applied by way of the first data line DLh. The second voltage may be applied by way of the second data line DL1. Thus, the first pixel electrode 160 may be driven as a high pixel, and the second pixel electrode 170 may be driven as a low pixel.

The opposite substrate 200 includes a second substrate 210, a black matrix BM, a protection layer 220 and a common electrode CE.

The second substrate 210 faces the first substrate 110. The second substrate 210 may include a material which has relatively high transmittance, thermal resistance, and chemical resistance. For example the second substrate 210 may include any one selected from the group consisting of glass, polyethylenenaphthalate, polyethylene terephthalate, polyacryl and a mixture thereof.

The black matrix BM is disposed on the second substrate 210. The black matrix BM includes light blocking material. The black matrix BM is formed in a non-display area. The black matrix BM overlaps the gate line GL, the first and second data lines DLh and DL1, the first and second thin film transistor TFT1 and TFT2 of the array substrate 100. The black matrix BM may overlap a portion of the first and second pixel electrodes 160 and 170 of the array substrate 100.

The protection layer 220 is disposed on the second substrate 210 on which the black matrix BM is formed. The protection layer 220 flattens (planarizes) and protects the black matrix, and prevents outflow of impurities. The protection layer 220 may include an acrylic-epoxy material.

The common electrode CE is disposed on the protection layer 220. The common electrode CE may be formed over an entire of the second substrate 210. The common electrode CE may include a transparent conductive material, such as indium tin oxide (ITO), indium zinc oxide (IZO) and etc.

The liquid crystal layer 300 is disposed between the array substrate 100 and the opposite substrate 200. The liquid crystal layer 300 includes liquid crystal molecules having optical anisotropy. The liquid crystal molecules are driven by electric fields formed by the first and second electrodes 160 and 170 and the common electrode CE, so that an image is displayed by polarizing light passing through the liquid crystal layer 300. The liquid crystal layer 300 further includes photocurable material, such as a reactive mesogen. The reactive mesogen may be photocured, so that the liquid crystal molecules may have a pretilt angle.

Figure 5A:
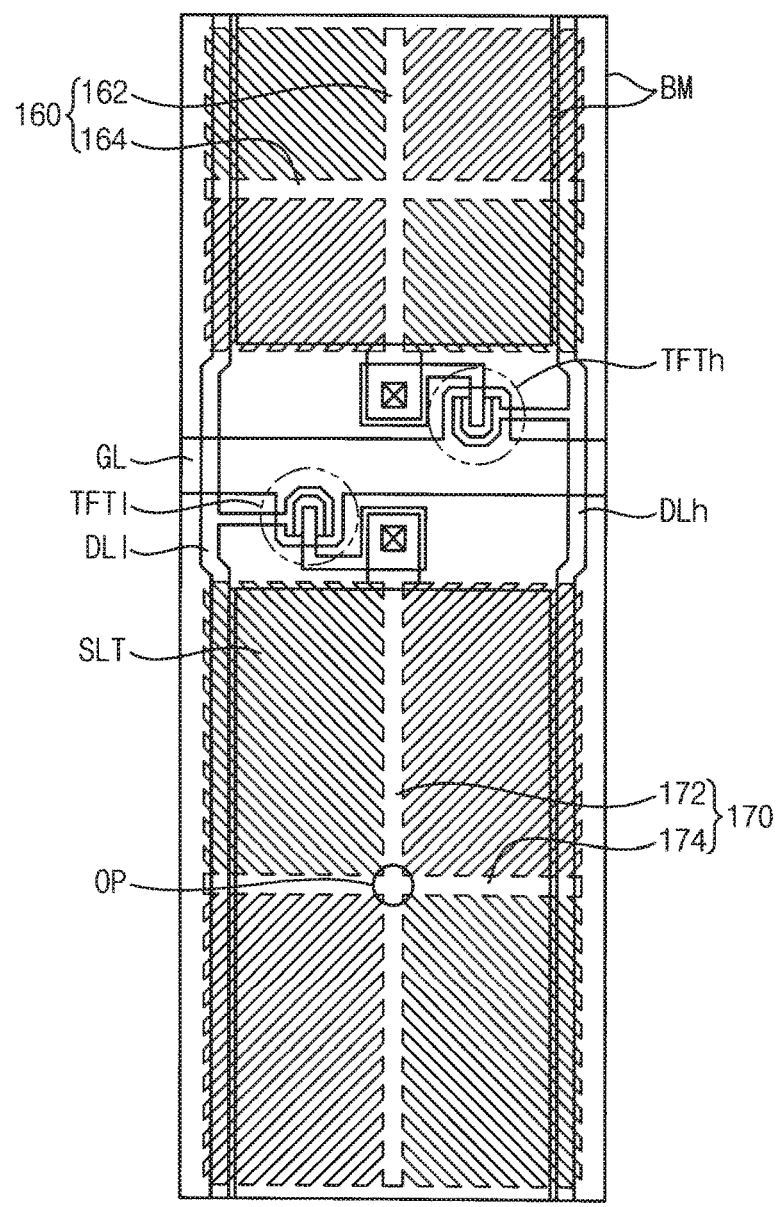
FIGS. 5A, 5B and 5C are top plan views illustrating yet other display panels in accordance with the present disclosure.
Figure 5A:
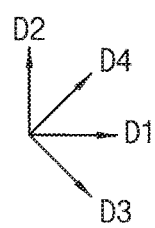
Figure 5B:
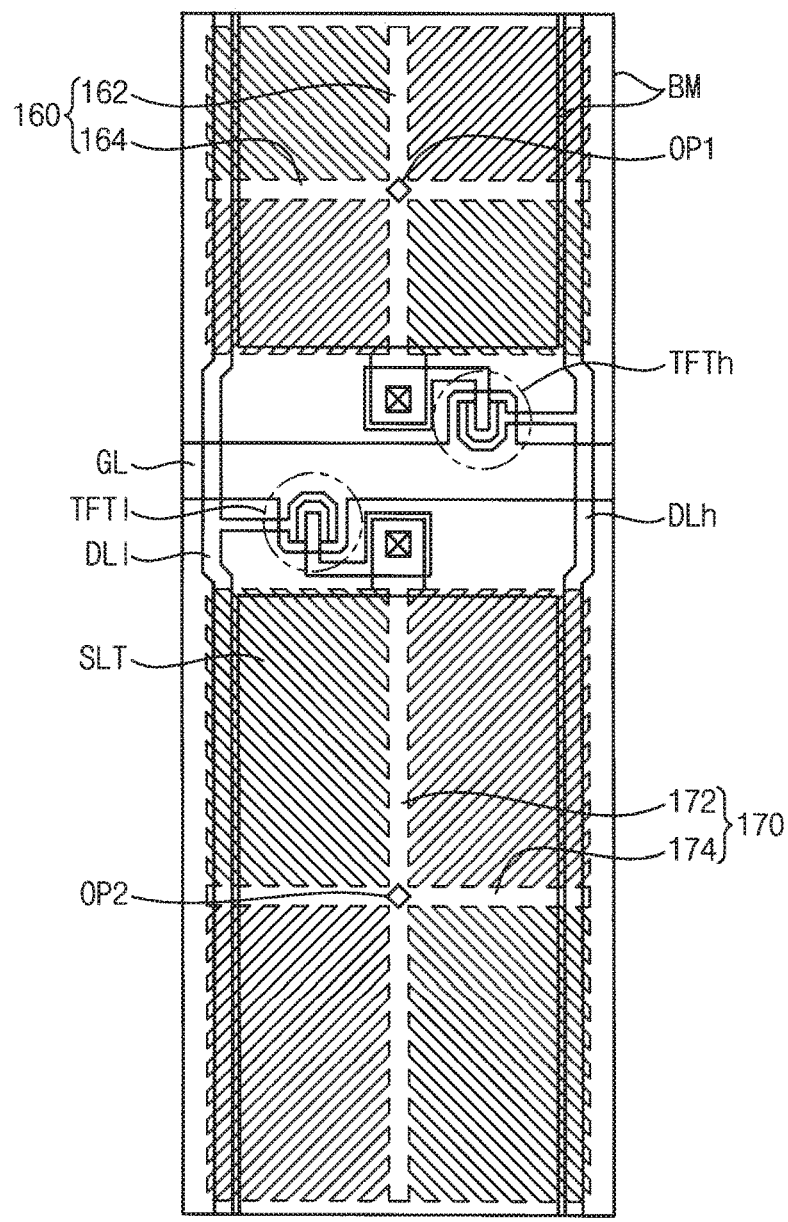
Figure 5C:
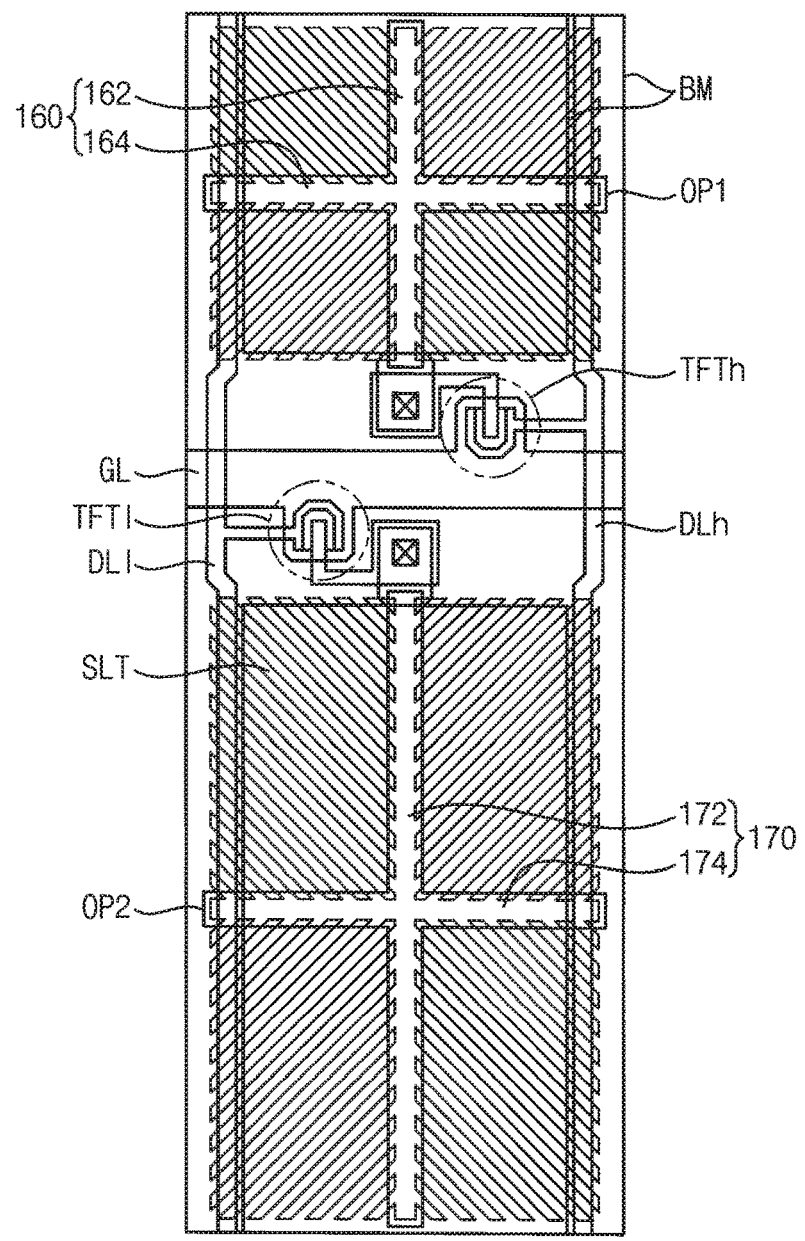

FIGS. 5A to 5C are plan views illustrating further display panels according to other exemplary embodiments in accordance with the present disclosure of inventive concept(s).

Referring to FIG. 5A, a display panel is substantially same as the display panel of FIGS. 3 to 4B, except for it having just one opening OP. Thus, any further detailed descriptions concerning the same elements will be briefly described or be omitted.

The display panel includes an array substrate, an opposite substrate facing the array substrate and a liquid crystal layer between the array substrate and the opposite substrate.

The array substrate includes a first substrate, a gate line GL, a first data line DLh, a second data line DL1, a first insulation layer, first and second thin film transistors TFT1 and TFT2, a second insulation layer 130, a color filter CF, a passivation layer 140, a first pixel electrode 160 and a second pixel electrode 170. The first pixel electrode 160 includes a first stem 162, a second stem 164 and a plurality of slits SLT. The second pixel electrode 170 includes a first stem 172, a second stem 174 and a plurality of slits SLT.

The opposite substrate includes a second substrate, a black matrix BM, a protection layer and a common electrode.

The first pixel electrode 160 may be driven as a high pixel, and the second pixel electrode 170 may be driven as a low pixel.

An opening OP is formed through the passivation layer 140. The opening OP is formed at a display area on which an image is displayed. In a plan view, the opening OP is spaced apart from the black matrix BM. Thus, the opening OP is not overlapped with the black matrix BM. The opening OP overlaps the second pixel electrode 170.

In a plan view, an opening of the passivation layer 140 is not formed in the pixel first electrode 160. The first pixel electrode 160 may be driven as a high pixel. Generally, size of the first pixel electrode 160 may be smaller than size of the second pixel electrode 170 which is driven as a low pixel. Thus, to reduce the number of the opening OP, an opening is formed only in the second pixel electrode 170 which has a relatively larger size in a plan view, so that texture formed near the opening OP may be reduced with efficiently positioning the opening OP in the display area.

In addition, as reducing the number of the opening OP, optical property changes at an interface between a pixel electrode and a color filter may be decreased.

Referring to FIG. 5B, a display panel is substantially same as a display panel of FIGS. 3 to 4B, except for the different shapes of the corresponding first and second openings OP1 and OP2. Thus, any further detailed descriptions concerning the same elements will be briefly described or be omitted. In one embodiment, the openings have diamond shapes. It is within the contemplation of the disclosure to have yet other shapes beside circles and diamonds. The shapes are selected for improved side visibility of the formed images.

The display panel includes an array substrate, an opposite substrate facing the array substrate and a liquid crystal layer between the array substrate and the opposite substrate.

The array substrate includes a first substrate, a gate line GL, a first data line DLh, a second data line DL1, a first insulation layer, first and second thin film transistors TFT1 and TFT2, a second insulation layer 130, a color filter CF, a passivation layer 140, a first pixel electrode 160 and a second pixel electrode 170. The first pixel electrode 160 includes a first stem 162, a second stem 164 and a plurality of slits SLT. The second pixel electrode 170 includes a first stem 172, a second stem 174 and a plurality of slits SLT.

The opposite substrate includes a second substrate, a black matrix BM, a protection layer and a common electrode.

A first opening OP1 is formed on the passivation layer 140. The first opening OP1 is formed at a display area which an image is displayed on, and passes light through. In a plan view, the first opening OP1 is spaced apart from the black matrix BM. Thus, the first opening OP1 is not overlapped with the black matrix BM. The first opening OP1 overlaps the first pixel electrode 160. The first opening OP1 may have a quadrangle shape. For example, the first opening OP1 may be a rhombus shape having apexes disposed in a line in parallel with a first direction and in a line in parallel with a second direction.

Entire portion of the first opening OP1 is overlapped with the first stem 162, the second stem 164 or the slits SLT of the first pixel electrode 160. Thus, the first opening OP1 is covered with the first pixel electrode 160, so that the color filter CF doesn't make contact with the liquid crystal layer. Thus, outflow of impurities form the color filter CF to the liquid crystal layer may be prevented.

A second opening OP2 is formed on the passivation layer 140. The second opening OP2 is formed at a display area which an image is displayed on, and passes light through. In a plan view, the second opening OP2 is spaced apart from the black matrix BM. Thus, the second opening OP2 is not overlapped with the black matrix BM. The second opening OP2 overlaps the second pixel electrode 170. The second opening OP2 may have a quadrangle shape. For example, the second opening OP2 may be a rhombus shape having apexes disposed in a line in parallel with a first direction and in a line in parallel with a second direction.

Entire portion of the second opening OP2 is overlapped with the first stem 172, the second stem 174 or the slits SLT of the second pixel electrode 170. Thus, the second opening OP2 is covered with the second pixel electrode 170, so that the color filter CF doesn't make contact with the liquid crystal layer. Thus, outflow of impurities form the color filter CF to the liquid crystal layer may be prevented.

Referring to FIG. 5C, a display panel is substantially same as a display panel of FIGS. 3 to 4B, except for the shapes of the first and second openings OP1 and OP2. Thus, any further detailed descriptions concerning the same elements will be briefly described or be omitted. Here the recesses of the first and second openings OP1 and OP2 substantially follow the shapes of the stems.

The display panel includes an array substrate, an opposite substrate facing the array substrate and a liquid crystal layer between the array substrate and the opposite substrate.

The array substrate includes a first substrate, a gate line GL, a first data line DLh, a second data line DL1, a first insulation layer, first and second thin film transistors TFT1 and TFT2, a second insulation layer 130, a color filter CF, a passivation layer 140, a first pixel electrode 160 and a second pixel electrode 170. The first pixel electrode 160 includes a first stem 162, a second stem 164 and a plurality of slits SLT. The second pixel electrode 170 includes a first stem 172, a second stem 174 and a plurality of slits SLT.

The opposite substrate includes a second substrate, a black matrix BM, a protection layer and a common electrode.

A first opening OP1 is formed on the passivation layer 140. The first opening OP1 is formed at a display area which an image is displayed on, and passes light through. In a plan view, the first opening OP1 is spaced apart from the black matrix BM. Thus, the first opening OP1 is not overlapped with the black matrix BM.

The first opening OP1 overlaps the first stem 162 and the second stem 164 of the first pixel electrode 160. Thus, the first opening OP1 may have substantially same shape as the first stem 162 and the second stem 164 in a plan view.

A second opening OP2 is formed on the passivation layer 140. The second opening OP2 is formed at a display area which an image is displayed on, and passes light through. In a plan view, the second opening OP2 is spaced apart from the black matrix BM. Thus, the second opening OP2 is not overlapped with the black matrix BM.

The second opening OP2 overlaps the first stem 172 and the second stem 174 of the second pixel electrode 170. Thus, the second opening OP2 may have substantially same shape as the first stem 172 and the second stem 174 in a plan view.

Although a recess is formed at a portion of the color filter corresponding to the first or second opening OP1 or OP2, the liquid crystal director adjacent to the recess is equal to liquid crystal director adjacent to the first or second opening OP1 or OP2. Thus, textures formed near the first or second opening OP1 or OP2 may be reduced.

FIGS. 6A to 12 are cross-sectional views illustrating a method of manufacturing a display panel according to an exemplary embodiment in accordance with the present disclosure of inventive concept(s).

Figure 6A:
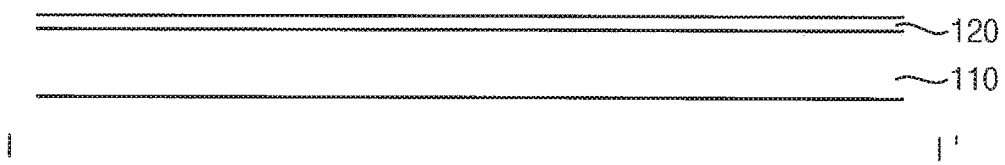
FIGS. 6A, 6B, 7A, 7B, 8A, 8B, 9A, 9B, 10A, 10B, 11A, 11B and 12 are cross-sectional views illustrating a method of manufacturing a display panel according to an exemplary embodiment of the present disclosure of inventive concept(s).
Figure 6B:
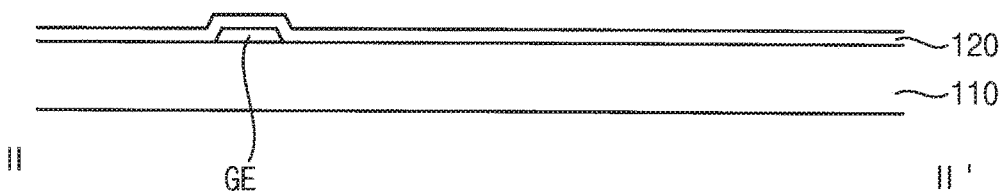

Referring to FIGS. 1, 6a and 6b, a metal layer is formed on a first substrate 110, and then the metal layer may be partially etched by a photolithography process or an etching process using an additional etching mask. Hence, a gate pattern may be formed on the first base substrate. The gate pattern includes the gate lines GL and corresponding gate electrodes GE.

The gate lines GL extends in a first direction D1. Each gate line GL is electrically connected to its respective gate electrodes GE. For example, the gate electrode GE is integrally protruded from the gate line GL in a second direction D2 which is perpendicular to the first direction D1.

The first insulation layer 120 is formed on the first substrate 110 on which the gate pattern is pre-formed. The first insulation layer 120 may be formed by a spin coating process, a printing process, a sputtering process, a CVD process, an ALD process, a PECVD process, an HDP-CVD process or a vacuum evaporation process in accordance with ingredients included in the first insulation layer.

Figure 7A:
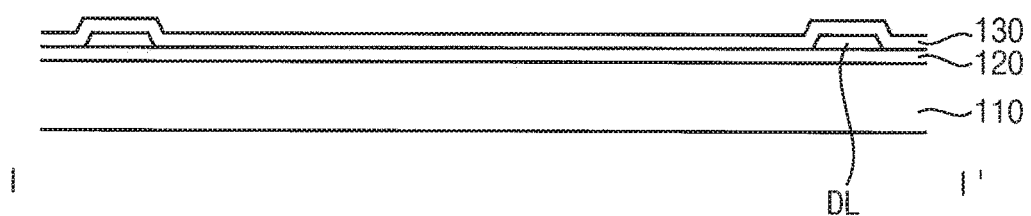
Figure 7B:
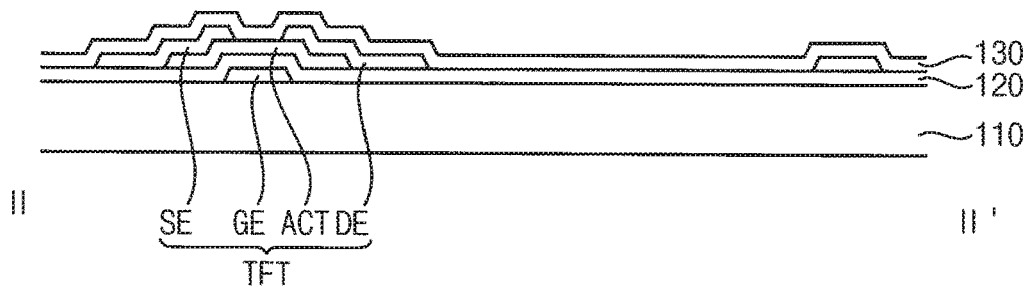

Referring to FIGS. 1, 7A and 7B, a semiconductive layer and a metal layer are formed on the first insulation layer 120, and then the semiconductive layer and metal layer may be partially etched by a photolithography process or an etching process using an additional etching mask. Hence, an active pattern ACT and a data wirings pattern are formed on the first insulation layer. The data wirings pattern includes the data lines DL, the source electrodes SE, and drain electrodes DE. The active pattern ACT may be formed firstly, and then the data wirings pattern may be formed secondly. In addition, the active pattern ACT and the data wirings pattern may be simultaneously formed. Respective ones of gate electrode GE, active pattern ACT, source electrode SE and drain electrode DE form respective ones of the thin film transistors TFT.

The data lines DL extend in the second direction D2. Each data line DL is electrically connected to a respective source electrode SE. The source electrode SE overlaps the active pattern ACT. The drain electrode DE is spaced apart form the source electrode SE, and overlaps the active pattern ACT.

The second insulation layer 130 is formed on the first insulation layer 120 on which the active pattern ACT and the data wirings patter are formed. The second insulation layer 130 may be formed by a spin coating process, a printing process, a sputtering process, a CVD process, an ALD process, a PECVD process, an HDP-CVD process or a vacuum evaporation process in accordance with ingredients included in the first insulation layer.

Figure 8A:
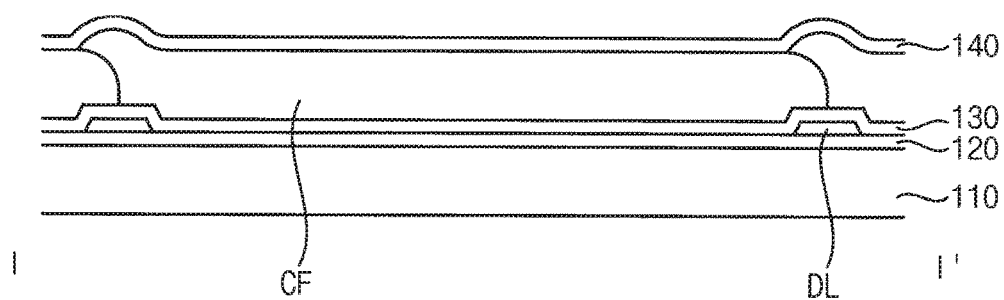
Figure 8B:
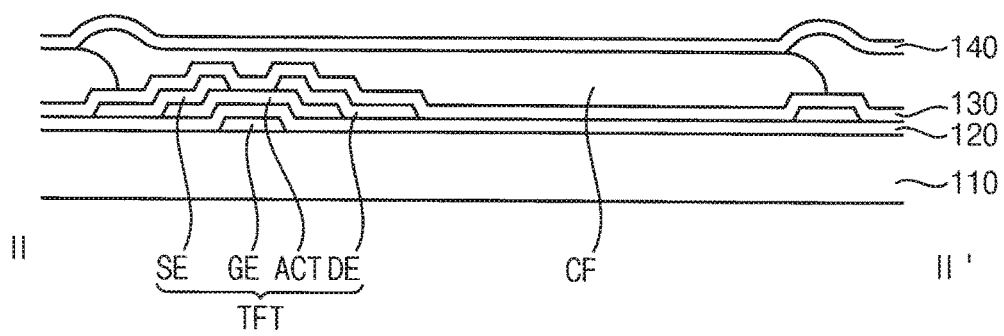

Referring to FIGS. 1, 8A and 8B, a color filters layer CF-DF' is formed on the second insulation layer 130. The respective color filters CF, CF', CF", etc. may be formed by appropriately pigmented photoresists that are selectively patterned and/or placed using a mask and developed using a developing solution.

A passivation layer 140 is blanket formed on the color filters CF. The passivation layer 140 may be formed by a spin coating process, a printing process, a sputtering process, a CVD process, an ALD process, a PECVD process, an HDP-CVD process or a vacuum evaporation process in accordance with ingredients included in the first insulation layer.

Figure 9A:
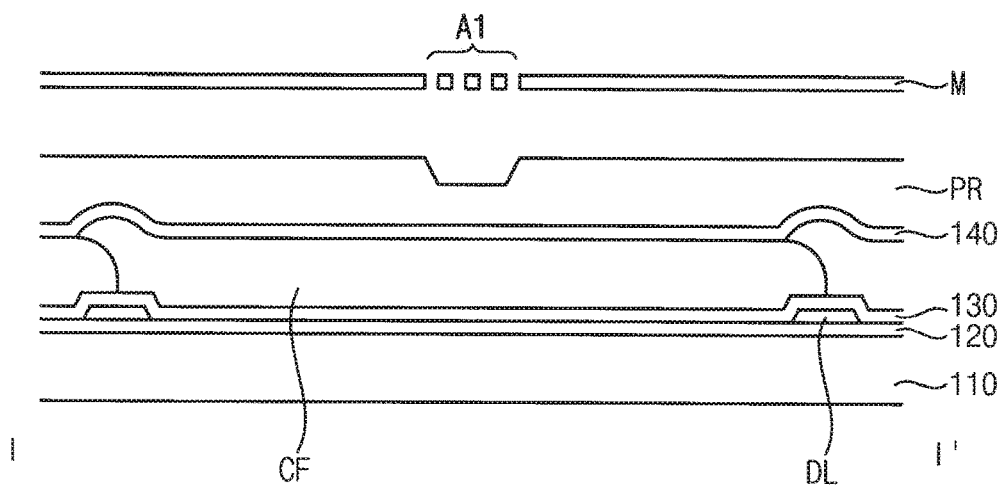
Figure 9B:
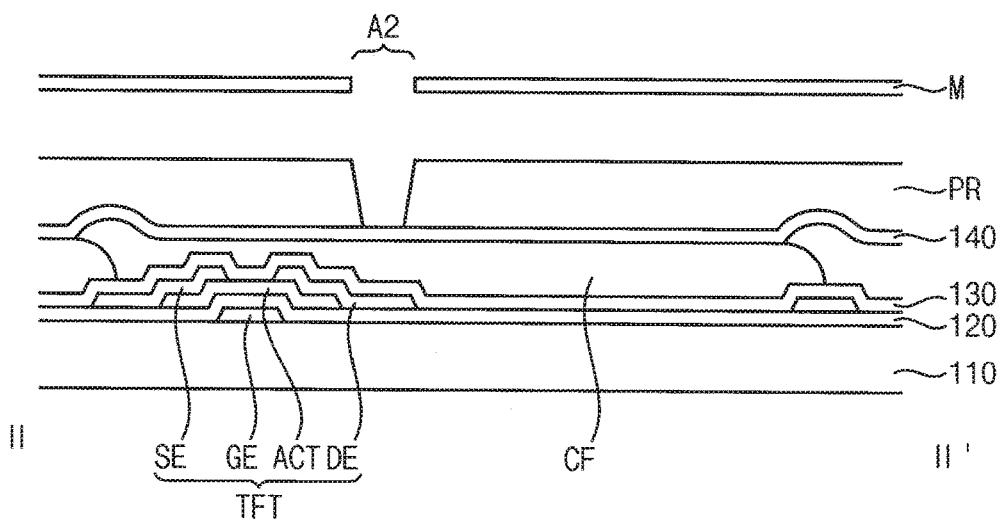

Referring to FIGS. 1, 9A and 9B, a photoresist composition is coated on the passivation layer 140, and then a photoresist layer PR is formed using a mask M having a first area A1 and a second area A2. A plurality of slits or half-tone area may be formed at the first area A1 of the mask M. An opening is formed at the second area A2 of the mask M. Accordingly, the photoresist layer PR has a recess corresponding to the first area A1 (FIG. 9A) and a hole corresponding to a second area A2 (FIG. 9B).

Figure 10A:
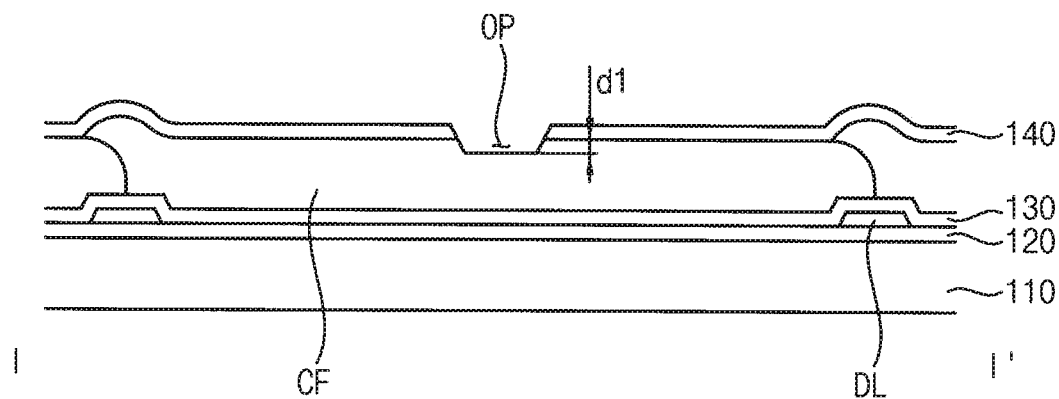
Figure 10B:
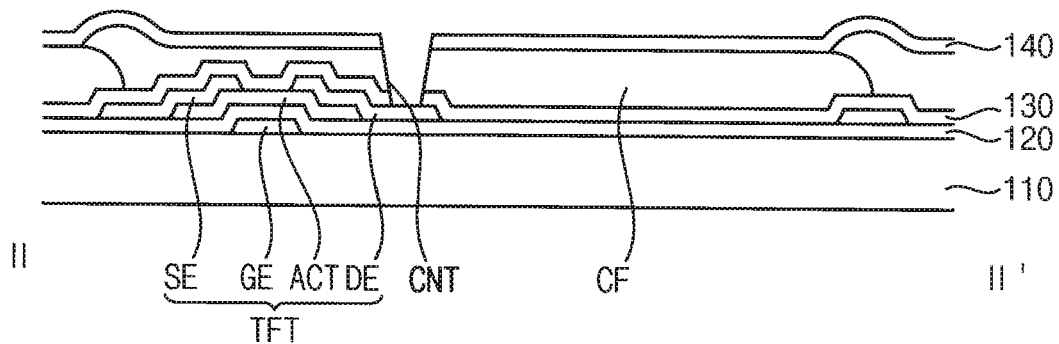

Referring to FIGS. 1, 10A and 10B, an opening OP through the passivation layer 140 and a contact hole CNT through the passivation layer 140 and the color filter CF is formed. The opening OP is formed corresponding to the first area (refers to A1 of FIG. 9A), and the contact hole CNT is formed in the second area (refers to A2 of FIG. 9B)

The opening OP is formed in a display area which an image is displayed on, and passes light through. The opening OP exposes the color filter CF. At this time, a recess may be formed at a portion of the color filter CF exposed by the opening OP. The photoresist layer PR has a recess at the first area corresponding to the opening OP, so that a first depth d1 of the recess of the color filter CF may be decreased by the dry etching process. Thus, damage to the color filter during forming the opening OP may be reduced. For example, the first depth d1 of the recess of the color filter CF is less than about 0.5 μm.

The contact hole is formed through the passivation layer 140 and the color filter CF to expose the drain electrode DE.

Figure 11A:
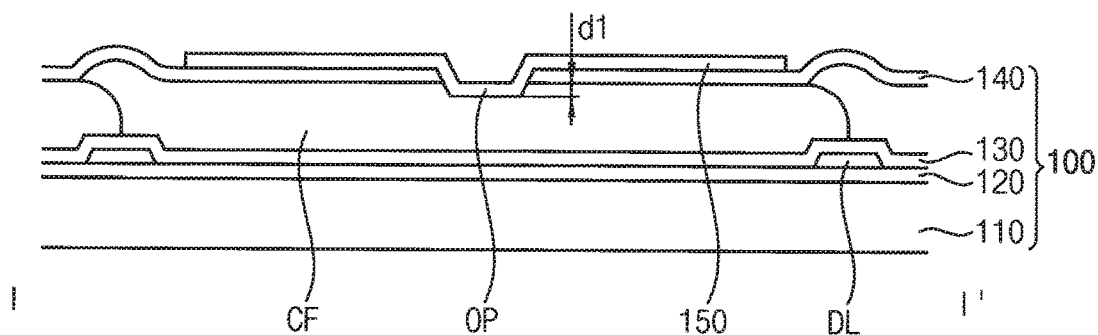
Figure 11B:
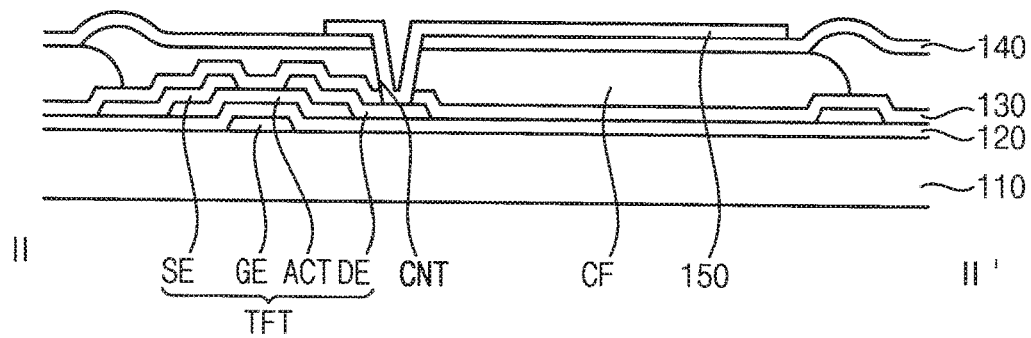

Referring to FIGS. 1, 11A and 11B, a transparent conductive layer is blanket formed on the passivation layer 140 through which the opening OP and the contact hole CNT have been formed. Next, the transparent conductive layer may be partially etched by a photolithography process or an etching process using an additional etching mask. Hence, a pixel electrode 150 is formed.

The pixel electrode 150 is electrically connected to the drain electrode DE of the thin film transistor TFT through the contact hole CNT. The first pixel electrode 150 may directly contact to the color filter CF through the opening OP.

The first substrate 110, the gate line GL, the first insulation layer 120, the data line DL, the thin film transistor TFT, the second insulation layer 130, the color filter CF, the passivation layer 140 and the pixel electrode 150 forms an array substrate 100.

Figure 12:
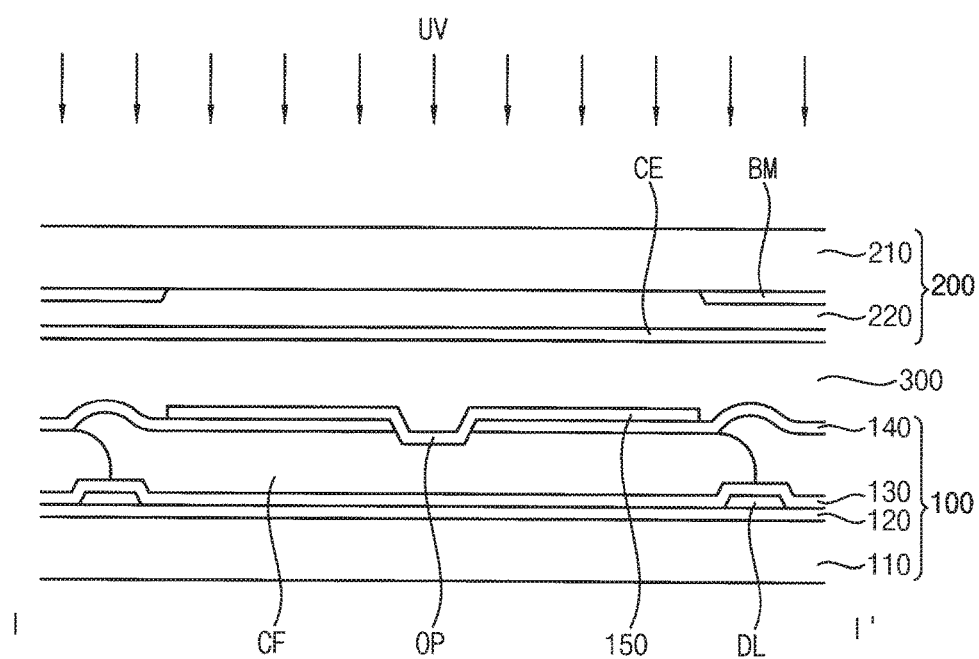

Referring to FIGS. 1 and 12, an opposite substrate 200 is formed. For example, a black matrix BM is formed on the second substrate 210. A protection layer 220 is formed on the second substrate 210 on which the black matrix BM is formed. A common electrode CE is formed on the protection layer 220.

Next, a liquid crystal layer 300 is provided between the array substrate 100 and the opposite substrate 200. The liquid crystal layer 300 may be formed by injecting a liquid crystal material between the array substrate 100 and the opposite substrate 200. The liquid crystal material may include liquid crystal molecules and reactive mesogen molecules.

And then, after applying an electric field to the liquid crystal layer 300, the liquid crystal layer 300 irradiated by light UV to photocure the reactive mesogens of the liquid crystal layer 300 and thus form an alignment layer. For example, after applying the electric field to the liquid crystal layer 300, ultra violet ray may be irradiated to the liquid crystal layer 300 in a direction from the second substrate 210 to the first substrate 110. Accordingly, the reactive mesogen may be photocured, so that the liquid crystal molecules may have a pretilt angle in accordance with the so-formed alignment layer.

At this time, the opening OP of passivation layer 140 of the array substrate 100 is disposed in a display area where light passes. Thus, during a photocuring process to photocure the liquid crystal molecules of the liquid crystal layer 300, photocurable impurities formed adjacent to the opening OP may be cured at the same time such that they will not flow elsewhere after be hardened. Therefore, display quality degradation caused by otherwise mobile impurities from the color filter CF may be prevented.

Referring to FIGS. 6A to 12, forming display panel includes forming an array substrate, forming an opposite substrate and forming a liquid crystal layer.

Forming the array substrate includes forming a gate pattern, forming a first insulation layer, forming a first insulation layer, forming an active pattern and forming a data pattern, forming a second insulation layer, forming a color filter, forming a passivation layer, forming an opening, and forming a pixel electrode.

Forming the opposite substrate includes forming a black matrix, forming a protection layer, and forming a common electrode.

Forming the liquid crystal layer includes injecting liquid crystal material and photocuring.

According to the present disclosure of inventive concept(s), an opening of a passivation layer of an array substrate of a display panel is disposed in a display area to form a depression and provide an area through which UV light can pass, so that mobile impurities of the color filter near the opening may be cured (and thus rendered immobile) during photocuring process for pretilt angle of liquid crystal molecules of a liquid crystal layer. Thus, display quality degradation caused by the impurities form the color filter may be prevented.

In addition, half tone mask is used to form the opening of the passivation layer, so that damage to the color filter CF may be decreased.

The foregoing is illustrative of the present disclosure of inventive concept(s) and is not to be construed as limiting thereof. Although a few exemplary embodiments have been described, those skilled in the art will readily appreciate in light of the foregoing that many modifications are possible in the exemplary embodiments without materially departing from the novel ideas and advantages of the present disclosure of inventive concept(s). Accordingly, all such modifications are intended to be included within the scope of the present teachings. In the claims, means-plus-function clauses are intended to cover the structures described herein as performing the recited function and not only structural equivalents but also equivalent structures.

What is claimed is:

1. A method of manufacturing a display panel comprising:
   forming an array substrate comprising:
      forming a thin film transistor on a substrate;
      forming a color filter on the thin film transistor;
      forming a passivation layer on the color filter to cover the color filter;
      forming an opening through the passivation layer extending into the color filter, so that a groove is formed on a top surface of the color filter; and
      forming a pixel electrode on the passivation layer, the pixel electrode electrically connected to the thin film transistor, the pixel electrode overlapping the opening of the passivation layer and making contact with the groove of the color filter;
   forming an opposite substrate facing the array substrate; and
   forming a liquid crystal layer between the array substrate and the opposite substrate.

2. The method of claim 1, wherein forming the liquid crystal layer comprises:
   injecting a liquid crystal material between the array substrate and the opposite substrate, the liquid crystal material comprising liquid crystal molecules and at least one curable reactive mesogen; and hardening the reactive mesogen by irradiating light.

3. The method of claim 2, wherein hardening the reactive mesogen comprises irradiating light in a direction from the array substrate to the opposite substrate.

4. The method of claim 1, wherein forming the opening through the passivation layer comprises:
   dry etching the passivation layer using a mask having a slit or half-tone area at a first area corresponding to the opening.

5. The method of claim 1, wherein in forming the opening through the passivation layer,
   a recess is formed extending into the color filter by etching a portion of the color filter corresponding to the opening, and a depth of the recess of the color filter is less than about 0.5 μm.

* * * * *